United States Patent
Igarashi et al.

(10) Patent No.: US 8,120,237 B2
(45) Date of Patent: Feb. 21, 2012

(54) PHOTOLUMINESCENT COMPOSITION AND LIGHT SOURCE DEVICE

(75) Inventors: Takahiro Igarashi, Kanagawa (JP); Tsuneo Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 483 days.

(21) Appl. No.: 11/682,793

(22) Filed: Mar. 6, 2007

(65) Prior Publication Data
US 2007/0210707 A1  Sep. 13, 2007

(30) Foreign Application Priority Data
Mar. 9, 2006 (JP) .............................. JP2006-064615

(51) Int. Cl.
*H01J 1/54* (2006.01)
*C09K 11/59* (2006.01)
(52) U.S. Cl. .................. 313/486; 252/301.4 F; 313/503
(58) Field of Classification Search .................. 313/486, 313/503; 252/301.4 F
See application file for complete search history.

(56) References Cited

U.S. PATENT DOCUMENTS

| | | | |
|---|---|---|---|
| 6,621,211 B1* | 9/2003 | Srivastava et al. | 313/503 |
| 2004/0178389 A1* | 9/2004 | Furusawa et al. | 252/301.4 R |
| 2006/0028122 A1* | 2/2006 | Wang et al. | 313/503 |
| 2006/0081814 A1* | 4/2006 | Shida et al. | 252/301.4 F |
| 2007/0267967 A1* | 11/2007 | Naum | 313/503 |

FOREIGN PATENT DOCUMENTS

| | | |
|---|---|---|
| JP | 2000-243302 | 9/2000 |
| JP | 2001-200248 | 7/2001 |
| JP | 2001-200249 | 7/2001 |
| JP | 2001200248 A * | 7/2001 |
| JP | 2005-187797 | 7/2005 |
| JP | 2005-277441 | 10/2005 |
| JP | 2005-340813 | 12/2005 |

OTHER PUBLICATIONS

Park et al., "White ligh-emitting diodes of GaN-based Sr2SiO4:Eu and the luminescent properties," Applied Physics Letters, vol. 82, pp. 683-685, 2003.
Journal of the Electrochemical Society Article entitled Eu Yellow Phosphor for White-Light Emitting Diodes, available electronically Jun. 27, 2005, 4 pgs.

* cited by examiner

*Primary Examiner* — Joseph L Williams
*Assistant Examiner* — Nathaniel Lee
(74) *Attorney, Agent, or Firm* — K&L Gates LLP

(57) ABSTRACT

A phospholuminescent composition is provided that includes a phosphor having a composition represented by $Sr_xBa_{2-x}SiO_4$:Eu, wherein $0 \leqq x \leqq 2$. The phospholuminescent composition also includes a magnesium salt added to the phosphor. The composition has an excitation spectra such that the ratio of the intensity at a wavelength of 440 nm to the intensity at a wavelength of 360 nm is in the range of 0.82 to 0.85. Alternatively, the composition has an excitation spectra such that an intensity at a wavelength of 440 nm ranges from 1.2 to 1.3 times an intensity of said phosphor alone at a wavelength of 440 nm.

7 Claims, 4 Drawing Sheets

PHOTOLUMINESCENT COMPOSITION AND LIGHT SOURCE DEVICE

CROSS REFERENCES TO RELATED APPLICATIONS

The present application claims priority to Japanese Patent Application JP 2006-064615 filed in the Japanese Patent Office on Mar. 9, 2006, the entire contents of which is being incorporated herein by reference.

BACKGROUND

The present disclosure relates to a phospholuminescent composition including a phosphor and also to a light source device including this phospholuminescent composition and a blue light source.

A phosphor having the composition of $Sr_xBa_{2-x}SiO_4$:Eu is one that is able to emit light in a bluish green to yellow region by excitation with light of a blue to near-ultraviolet region and has recently been considered for application to white LED (light emitting diode).

With this phosphor, it has been pointed out that an efficiency of excitation with light in a blue region is considerably lower than an efficiency of excitation with light in a near-ultraviolet region. It has been confirmed from excitation spectra that an excitation intensity in the blue region is significantly lower than an excitation intensity in the near-ultraviolet region (see, for example, Japanese Patent Laid-Open No. 2005-277441 and Applied Physics Letters Vol. 82, No. 5, 683 (2003)).

In general, because a desired emission wavelength band is obtained from a wide range depending on the selection of compositional ratio, the use of phosphors has been studied in, for example, thin displays called FPD (flat panel display) such as organic EL (electroluminescence) displays, plasma displays and the like.

These displays ordinarily have a light source device such as a backlight. In recent years, attention has been paid to phosphors capable of emitting light in a desired wavelength band and a light source device having an arrangement including a blue light source, such as LED, serving also as an excitation light source for phosphor. This is for the reason that such an arrangement brings about, in the light source device, many advantages in that a drive circuit can be made simpler in arrangement than with the case where all colors are obtained by direct drive light sources such as LED's and that peripheral members (resins, LED chips and the like) can be more suppressed from degrading than with the case where light in the near-ultraviolet region is used as an excitation light source.

Accordingly, phosphors serving to constitute such a light source device are strongly demanded in respect of an improvement in efficiency of excitation with such light in the blue region as mentioned above.

SUMMARY

The present embodiments provide a phospholuminescent composition which includes a phosphor having such a composition as indicated above and is able to improve an efficiency of excitation with light in a blue region.

A phospholuminescent composition according to a first embodiment includes a phosphor having a composition of $Sr_xBa_{2-x}SiO_4$:Eu wherein $0 \leq x \leq 2$ and a magnesium salt added to the phosphor. The phospholuminescent composition has such excitation spectra that a value of (an intensity at a wavelength of 440 nm/an intensity at a wavelength of 360 nm) ranges from 0.82 to 0.85.

According to a second embodiment, there is provided a phospholuminescent composition, which includes a phosphor having a composition of $Sr_xBa_{2-x}SiO_4$:Eu wherein $0 \leq x \leq 2$ and a magnesium salt added to the phosphor. The phospholuminescent composition has such excitation spectra that an intensity at a wavelength of 440 nm ranges from 1.2 times to 1.3 times an intensity at a wavelength of 440 nm of the phosphor alone.

According to a third embodiment, there is provided a light source device includes, at least, a blue light source and a phospholuminescent composition, the phospholuminescent composition including a phosphor having a composition of $Sr_xBa_{2-x}SiO_4$:Eu wherein $0 \leq x \leq 2$ and a magnesium salt added to the phosphor. The phospholuminescent composition has such excitation spectra that a value of (an intensity at a wavelength of 440 nm/an intensity at a wavelength of 360 nm) ranges from 0.82 to 0.85.

According to a fourth embodiment, there is provided a light source device including, at least, a blue light source and a phospholuminescent composition, the composition including a phosphor having a composition of $Sr_xBa_{2-x}SiO_4$:Eu wherein $0 \leq x \leq 2$ and a magnesium salt added to the phosphor. The phospholuminescent composition has such excitation spectra that an intensity at a wavelength of 440 nm ranges from 1.2 times to 1.3 times an intensity at a wavelength of 440 nm of the phosphor alone.

The phospholuminescent composition according to the first embodiment includes a phosphor having such a composition as defined above and a magnesium salt added to the phosphor, excitation spectra of the phospholuminescent composition being such that a value of (an intensity at a wavelength of 440 nm/an intensity at a wavelength of 360 nm) ranges from 0.82 to 0.85. As will be described hereinafter, this phospholuminescent composition is improved in an efficiency of excitation with light in a blue region.

Likewise, the phospholuminescent composition according to the second embodiment includes a phosphor having such a composition as defined above and a magnesium salt added thereto, excitation spectra of the phospholuminescent composition being such that an intensity at a wavelength of 440 nm ranges from 1.2 times to 1.3 times an intensity at a wavelength of 440 nm of the phosphor alone whereby an efficiency of excitation with light in a blue region can be improved.

The light source device according to the third embodiment includes, at least, a blue light source and a phospholuminescent composition. The phospholuminescent composition includes a phosphor having such a composition as defined above and a magnesium salt added to the phosphor, excitation spectra of the phospholuminescent composition being such that a value of (an intensity at a wavelength of 440 nm/an intensity at a wavelength of 360 nm) ranges from 0.82 to 0.85. As described below, because of the use of the phospholuminescent composition that is improved in an efficiency of excitation with light in a blue region, there can be obtained a light source device having excellent photoluminescence characteristics.

The light source device according to the fourth embodiment includes, at least, a blue light source and a phospholuminescent composition. The phospholuminescent composition includes a phosphor having such a composition as defined above and a magnesium salt added to the phosphor. Excitation spectra are such that an intensity at a wavelength of 440 nm ranges from 1.2 times to 1.3 times an intensity at a wavelength of 440 nm of the phosphor alone. As described below, because the phospholuminescent composition is able to improve an efficiency of excitation with light in a blue region, the resulting light source device has excellent photoluminescence characteristics.

Additional features and advantages are described herein, and will be apparent from, the following Detailed Description and the figures.

DETAILED DESCRIPTION

Embodiments are described with reference to the accompanying drawings.

First Embodiment

A phospholuminescent composition and a light source device according to the embodiment are illustrated.

In this embodiment, an instance where a light source device including a phospholuminescent composition is arranged to provide a display (e.g. a thin display) is illustrated.

Figure 1:
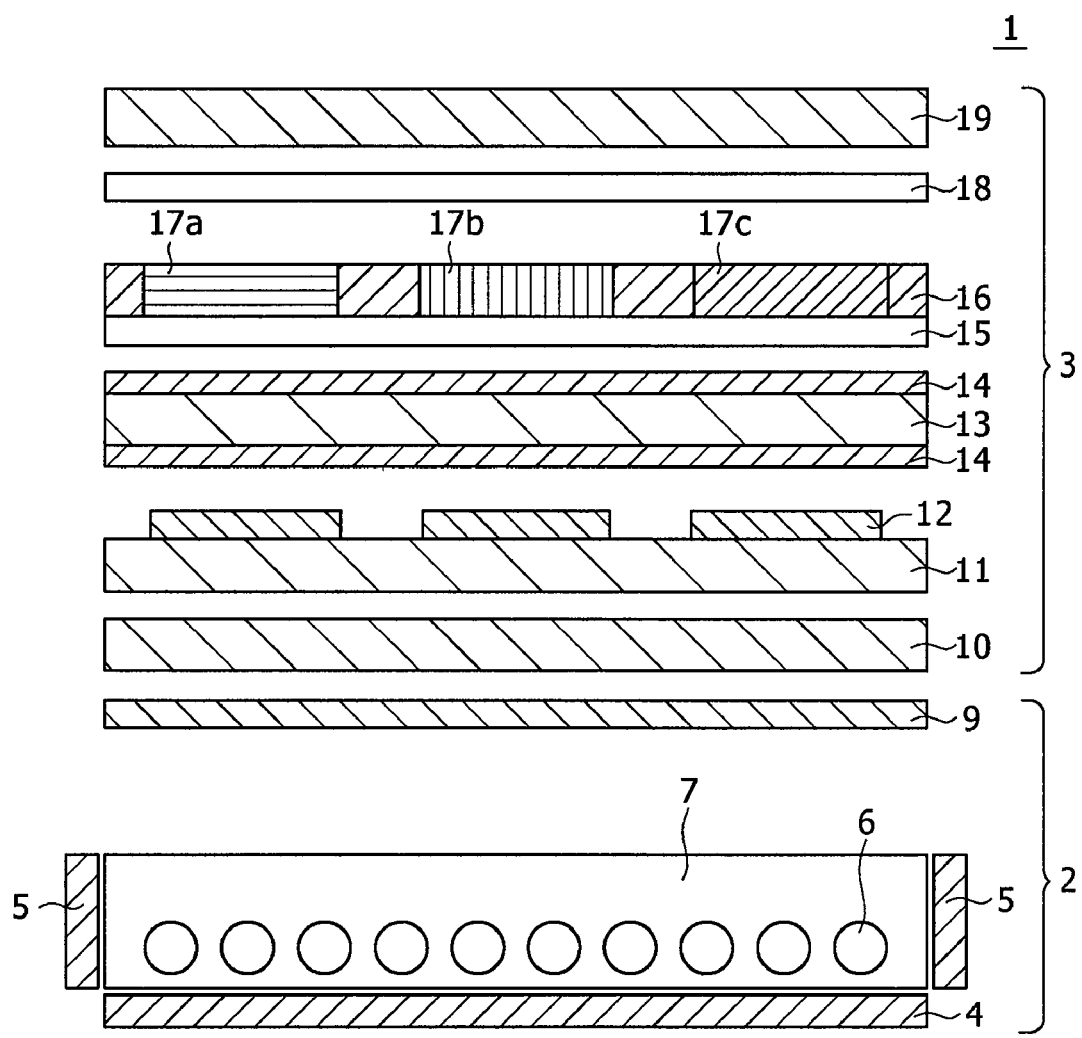
FIG. 1 is a schematic view showing an example of a light source device having a phospholuminescent composition according to an embodiment and also an example of a display using the light source device.

FIG. 1 schematically shows a display having a light source device according to the embodiment. In this embodiment, a display 1 has a light source device 2 and a optical device 3. Within a resin-made, optical transmission portion 7 of the light source device 2, there is provided a luminous body 6 constituted of a resin coating including, at least, a number of phosphors on a surface of a blue light source made, for example, of a blue LED. In the embodiment, the phosphors constituting the luminous body 6 include, for example, first phosphors that become, for example, a yellow phosphor or a red phosphor and second phosphors that become, for example, a bluish green phosphor or a green phosphor. In the light source device 2 having such an arrangement as set out above, white color chromaticity of the light source device 2 is wholly defined depending on the blue light source and the types of first and second phosphors, and an optical output corresponding to an intended color is enabled.

In the embodiment, a diffusion sheet 9 is provided at the closest vicinity of the light source device 2 facing to the light source 3. This diffusion sheet 9 is provided to uniformly, planarly lead light from both the blue light source and the first phosphors and second phosphors to the side of the optical device 3. At the back side of the light source device 2, a reflector 4 is formed. If necessary, a reflector 5 similar to the reflector 4 may be provided at the respective sides of the optical transmission portion 7.

It will be noted that in the light source device of the embodiment, a resin for the optical transmission portion 7 may be made of an epoxy resin, a silicone resin, a urethane resin or various types of transparent resins. The shape of the blue light source constituting the luminous body 6 may be of those appropriately selected from a side emitter type, a cannonball type and many other types.

On the other hand, the optical device 3 includes, from the side nearer to the light source device 2, a deflector 10, a glass substrate 11 for TFT (thin film transistor) and dot electrodes 13 on the surface thereof, a liquid crystal layer 13 and an orientation film 14 attached to opposite sides thereof, an electrode 15, a plurality of black matrices 16 and a first color (red) filter 17a, a second color (green) filter 17b and a third color filter 17c that, respectively, correspond to pixels, each provided between the adjacent black matrices 16, a glass substrate 18 kept away from the black matrices 16 and the color filters 17a to 17c, and a deflector 19 arranged in this order.

The deflectors 10 and 19 are ones wherein light oscillating in a specified direction is formed. The TFT glass substrate 11, dot electrodes 12 and electrode 15 are, respectively, provided for switching the liquid crystal layer 13 that allows only light oscillating in a specified direction to be transmitted, and because the orientation films 14 are provided in combination therewith, liquid crystal molecules within the liquid crystal layer 13 are arranged in a given direction with respect to the inclination thereof. Since the black matrices 16 are provided, light outputted from the color filters 17a to 17c corresponding to the respective colors can be improved in contrast thereof. These black matrices 16 and the color filters 17a and 17c are attached to the glass substrate 18.

In the light source device 2 according to this embodiment, at least one of the first phosphor and the second phosphor should be formed of a phospholuminescent composition which includes a phosphor represented by $Sr_xBa_{2-x}SiO_4$:Eu wherein $0 \leqq x \leqq 2$, and a magnesium salt added to the phosphor.

In this arrangement, as set out hereinafter, excitation spectra of the phospholuminescent composition are, for example, such that a value of (an intensity at a wavelength of 440 nm/an intensity at a wavelength of 360 nm) ranges from 0.82 to 0.85, so that an efficiency of excitation with light in a blue range is improved over an efficiency of excitation light in a near-ultraviolet region. Alternatively, excitation spectra of the phospholuminescent composition may be such that an intensity at a wavelength of 440 nm ranges from 1.2 times to 1.3 times an intensity at a wavelength of 440 nm of the phosphor alone, so that an efficiency of excitation with light in a blue region is improved.

When using the phospholuminescent composition which is improved in the efficiency of excitation with light in a blue region, excellent photoluminescence characteristics as would not been expected by use of the phosphor alone that is a main composition of the phospholuminescent composition can be obtained.

Especially, for constituting the light source device 2 inside the display 1 as in this embodiment, when the phospholuminescent composition having excellent photoluminescence characteristics are used, optical characteristics of the light source device 2 are improved in addition to the simplification of a drive circuit for avoiding an arrangement attained by the use of light sources for direct drive of LED's for all colors and suppression of degradation of peripheral members (resins, LED chips and the like) for avoiding the use of light in a near ultraviolet region as an excitation light.

An instance of a method for preparing the phospholuminescent composition according to this embodiment is now described.

In the embodiment, strontium carbonate (SrCO₃) and barium carbonate (NaCO₃) were, respectively, used as starting materials for strontium (Sr) and barium (Ba) making up of a finally obtained phosphor. It will be noted that no problem arises when using sulfates, sulfides, chlorides and the like in place of these carbonates.

For a starting material for europium (Eu), europium oxide (Eu₂O₃) was used. Instead, a sulfate, sulfide, chloride or the like may be used with no problem involved therein.

For a starting material of silicon (Si), silicon dioxide (SiO₂) was used but not limited thereto.

These starting materials were successively mixed at ratios of starting materials, i.e. at given stoichiometric ratios, within a compositional range of $Sr_xBa_{2-x}SiO_4$:Eu wherein $0 \leq x \leq 2$. Eu was successively added in an amount ranging from 1 mol % to 9 mol %.

When the concentration of Eu was at 2 mol % to 5 mol %, the characteristic (photoluminescence intensity) of finally obtained phospholuminescent composition was significantly good. This is considered for the reason: Eu serves as an emission center in the phosphor; and if Eu is too small in concentration, the emission intensity lowers, and if the concentration is too large, the emission intensity lowers owing to the phenomenon of concentration quenching.

Thereafter, 20 g in total weight of the composition was provided and placed in a 500 ml polymer container, to which 200 ml of ethanol and 100 g of 5 mm☐ alumina balls, followed by rotary ball milling (stirring) for three hours. After the ball milling, the mixture was filtered to obtain a filter cake serving as a precursor of final sample, followed by drying in an atmosphere of air at 50° C. for two hours. After the drying, the cake was ground into pieces in an alumina mortar to obtain an intermediate.

Thereafter, the intermediate was placed in a quartz tube, and a nitrogen gas containing 4% of a hydrogen gas was flown into the quartz tube at a flow rate of 10 to 1,000 ml/minute, followed by sintering at 1,000° C. to 1,400° C. to provide a phosphor serving as a main component of a finally obtained phospholuminescent composition.

It will be noted that the flow rate necessary for the nitrogen gas and hydrogen gas differ depending on the amount of the intermediate to be sintered. For instance, it is assumed that if the sintering amount is at about 5 g, a satisfactory flow rate is at about 500 ml/minute. In order to ensure reliable sintering, a greater flow rate may be used. It is to be noted that the sintering temperature was optimally at 1,200° C.

Subsequently, a given type of additive (magnesium salt) was added to the phosphor to prepare a phospholuminescent composition according to the embodiment.

First Example

In this example, such phospholuminescent compositions as set out above, i.e. phospholuminescent compositions each including a phosphor having given stoichiometric ratios within ranges of the composition expressed by $Sr_xBa_{2-x}SiO_4$:Eu wherein $0 \leq x \leq 2$, and a magnesium salt serving as an additive for the phosphor, were subjected to measurement of excitation spectra. Based on the excitation spectra, a value of (an intensity at a wavelength of 440 nm/an intensity at a wavelength of 360 nm) was determined, and an intensity at a wavelength of 440 nm of the phospholuminescent composition and an intensity at a wavelength of 440 nm of a phosphor alone having the same stoichiometric ratios as the phosphor used in the phospholuminescent composition were compared with each other.

The measurement of excitation spectra was made in such a way that an emission peak obtained by excitation with single color excitation light with a center wavelength of 440 nm was confirmed to be at a wavelength of 524 nm, after which the sample was irradiated while subjecting the single color excitation light to wavelength shift from 300 nm to 500 nm to measure and plot emission spectrum intensities at a wavelength of 524 nm (i.e. photoluminescence intensities at a wavelength of 524 nm). The resulting plotted curve was obtained as excitation spectra.

In the investigation of this example, the additives for the phospholuminescent composition used were barium chloride, barium carbonate, barium sulfate, barium fluoride, calcium chloride, calcium carbonate, calcium sulfate, calcium fluoride, magnesium chloride, magnesium carbonate, magnesium sulfate, magnesium fluoride, ammonium chloride, potassium chloride, oxalic acid, potassium phosphate, boric acid, aluminium chloride, aluminium carbonate, aluminium sulfate, and aluminium fluoride.

The phospholuminescent compositions of this embodiment were, respectively, prepared by adding, to 100 mols of a phosphor, each of the additives while changing the amount in increments of 5 mol within a range of 5 mols to 50 mols, followed by mixing in a ball mill or mortar to prepare intended phospholuminescent compositions. The amounts of the respective additives were confirmed according to an energy dispersion fluorescent X-ray analysis (EDX), an induction coupling plasma emission analysis (ICP) and the like.

Table 1 shows a value of (an intensity at a wavelength of 360 nm/an intensity at a wavelength of 440 nm) and a photoluminescence intensity at a wavelength of 440 nm (i.e. a ratio to a photoluminescence intensity of an additive-free phosphor alone being taken as 100) with respect to excitation spectra of phospholuminescent compositions using the respective additives.

Although the determination of the value and the comparison between the photoluminescence intensities were carried out with respect to four types of compositions of $Sr_xBa_{2-x}SiO_4$:Eu wherein x=0.5, 1.0, 1.5 and 2.0 in every additive-containing phospholuminescent composition, a similar tendency was observed. Hence, the results of the case where x=1.0 are shown in Table 1 as a typical example.

TABLE 1

| | | Additive | | | | | | | | | | |
|---|---|---|---|---|---|---|---|---|---|---|---|---|
| | Amount | Magnesium chloride | Magnesium carbonate | Magnesium sulfate | Magnesium fluoride | Calcium chloride | Calcium carbonate | Calcium sulfate | Calcium fluoride | Barium chloride | Barium carbonate | Barium sulfate |
| 440 nm/ 360 nm | 10 mols | 0.832 | 0.831 | 0.834 | 0.816 | 0.701 | 0.700 | 0.668 | 0.753 | 0.771 | 0.781 | 0.621 |
| | 30 mols | 0.842 | 0.850 | 0.837 | 0.820 | 0.773 | 0.785 | 0.698 | 0.861 | 0.820 | 0.813 | 0.654 |
| | 50 mols | 0.834 | 0.831 | 0.832 | 0.822 | 0.770 | 0.800 | 0.700 | 0.866 | 0.810 | 0.814 | 0.654 |

TABLE 1-continued

|  | | Barium fluoride | Ammonium chloride | Potassium chloride | Potassium phosphate | Oxalic acid | Boric acid | Aluminium chloride | Aluminium carbonate | Aluminium sulfate | Aluminium fluoride | No additive |
|---|---|---|---|---|---|---|---|---|---|---|---|---|
| Relative photoluminescence intensity | 10 mols | 120 | 115 | 109 | 115 | 65 | 70 | 68 | 77 | 86 | 85 | 82 |
| | 30 mols | 136 | 130 | 129 | 125 | 59 | 56 | 55 | 64 | 92 | 90 | 85 |
| | 50 mols | 24 | 25 | 22 | 25 | 13 | 11 | 10 | 12 | 10 | 10 | 8 |

Additive

|  | Amount | Barium fluoride | Ammonium chloride | Potassium chloride | Potassium phosphate | Oxalic acid | Boric acid | Aluminium chloride | Aluminium carbonate | Aluminium sulfate | Aluminium fluoride | No additive |
|---|---|---|---|---|---|---|---|---|---|---|---|---|
| 440 nm/ 360 nm | 10 mols | 0.701 | 0.750 | 0.702 | 0.266 | 0.757 | 0.841 | 0.800 | 0.800 | 0.833 | 0.799 | 0.611 |
| | 30 mols | 0.791 | 0.779 | 0.796 | 0.267 | 0.804 | 0.869 | 0.858 | 0.845 | 0.863 | 0.878 | |
| | 50 mols | 0.800 | 0.781 | 0.800 | 0.263 | 0.807 | 0.866 | 0.858 | 0.844 | 0.875 | 0.890 | |
| Relative photoluminescence intensity | 10 mols | 85 | 85 | 90 | 10 | 87 | 25 | 88 | 90 | 91 | 95 | 100 |
| | 30 mols | 88 | 75 | 78 | 1 | 85 | 8 | 70 | 69 | 68 | 72 | |
| | 50 mols | 12 | 14 | 14 | 1 | 15 | 3 | 13 | 13 | 53 | 13 | |

The results of Table show that in all the compositions containing additives, the value of (an intensity at a wavelength of 440 nm/an intensity at a wavelength of 360 nm) with respect to the excitation spectra is improved over the value of the additive-free phosphor alone. More particularly, in contrast to the case where the efficiency of excitation with light in a near ultraviolet region lowers, an efficiency of excitation with light in a blue region is improved.

In this connection, however, it has been confirmed that with respect to the photoluminescence intensity at a wavelength of 440 nm, the compositions using substantially all the additives are lower than with the case of no additive (phosphor alone).

Especially, it has been confirmed that with magnesium additives (magnesium salts), specific and multiple properties are improved including not only an improved value of (an intensity at a wavelength of 440 nm/an intensity at a wavelength of 360 nm) with respect to the excitation spectra, but also an increased photoluminescence intensity. It has also been confirmed that according to the measurements, the value of (an intensity at a wavelength of 440 nm/an intensity at a wavelength of 360 nm) with respect to the excitation spectra particularly ranges from 0.82 to 0.85.

The excitation spectrum intensity at a wavelength of 440 nm is improved by not less than 1.2 times over the case using the phosphor alone by the addition of the magnesium salts. In general, with a phosphor, for example, it is known that selection of sintering temperature and time leads to an improved photoluminescence intensity, and if an optimum value is determined by the selection, an increase of the photoluminescence intensity is by as small as 5% when compared with the intensity prior to the selection. Under these circumstances of the phosphor, it is considered very useful from the standpoint of fabricating many types of devices from phosphor that the phospholuminescent composition of the embodiment exhibits a photoluminescence intensity that is as large as 1.2 times over the case using the phosphor alone. Although not specifically shown in Table 1 because of the instability, part of magnesium salts brings about results that an improvement is by 1.3 times or over.

In spite that the phospholuminescent compositions using the magnesium-based additives exhibit an excitation intensity in the blue region that does not always exceed an excitation intensity in the near ultraviolet region, excellent photoluminescence characteristics are obtained. This is considered for the reason that the band structure of the phosphor represented by the afore-indicated formula is changed by the addition of the additive.

Figure 2:
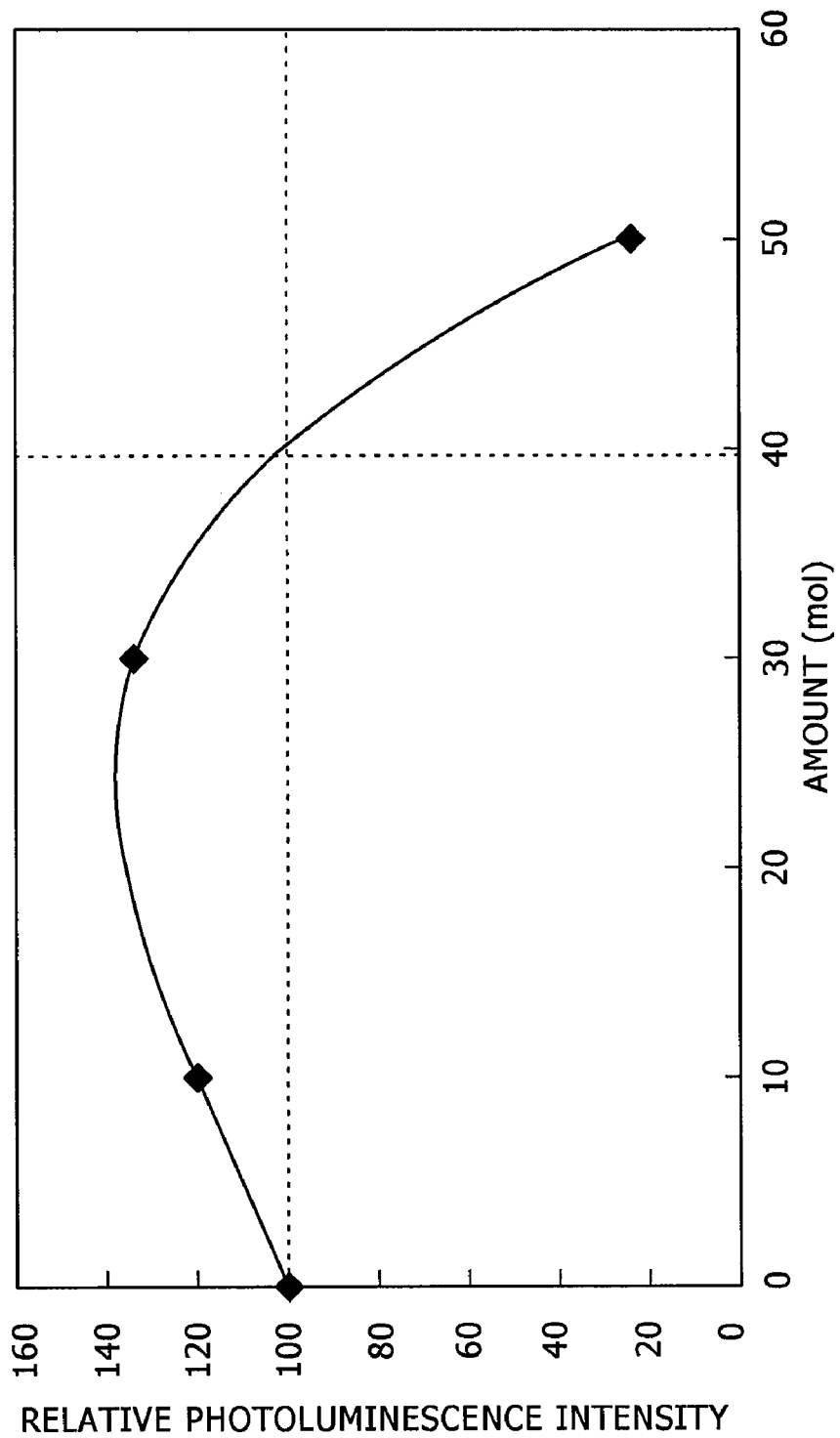
FIG. 2 is a graph showing the relation between the amount of an additive (i.e. a magnesium salt) and the relative phospholuminescence intensity based on the results of measurement using a phospholuminescent composition according to an embodiment.

Of these phospholuminescent compositions using the magnesium-based additives, a phospholuminescent composition containing magnesium chloride shows the highest photoluminescence or emission characteristics. The results of measurement of the relative photoluminescence intensity in relation to the amount of magnesium chloride are shown in FIG. 2.

The results of Table 1 confirm that for all types of magnesium-based additives, the case where the amount is at 30 mols (per 100 mols of the phosphor) is preferred, at least, over the cases of 10 mols and 50 mols and that good characteristics are obtained when using magnesium chloride. For instance, it has been made clear that with magnesium chloride, if the amount of magnesium chloride is not greater than 40 mols (per 100 mols of the phosphor), a satisfactorily high photoluminescence intensity is shown over the case where no additive is added (i.e. the phosphor is used singly).

Figure 3:
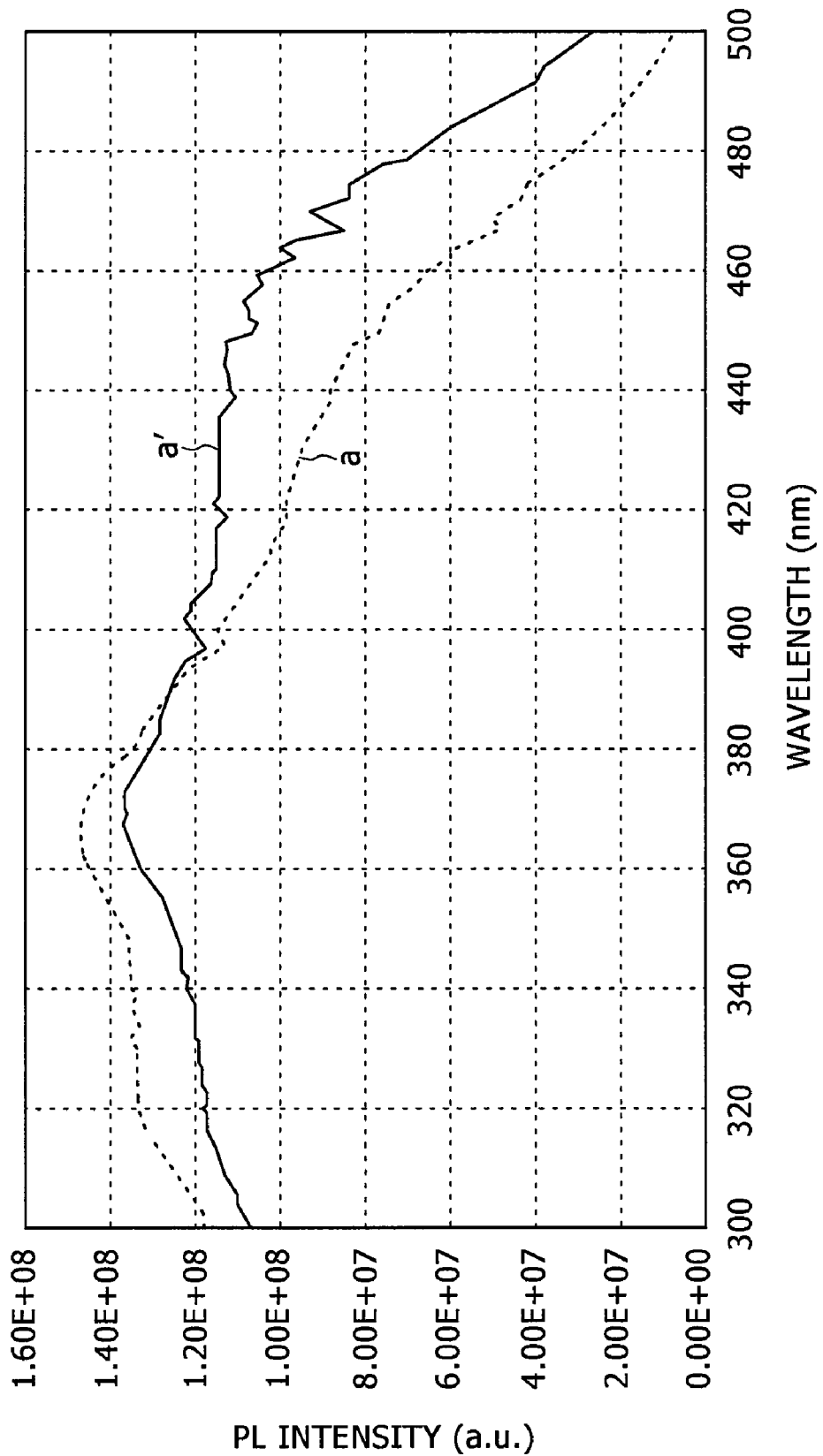
FIG. 3 is an excitation spectrum chart for illustrating an example of a phospholuminescent composition of an embodiment.

The excitation spectra of the phospholuminescent composition containing magnesium chloride (with an amount being at 30 mols) are shown in FIG. 3. Although the measurement of the spectrum was made for three types of the compositions of $Sr_xBa_{2-x}SiO_4$:Eu wherein x=0, 1 and 2, a similar tendency is shown and thus, the results of the case wherein x=0.5 are shown in FIG. 3 as an instance.

It has been confirmed that when compared with spectra (indicated by broken line a in the figure) of the phosphor alone having the composition of $Sr_xBa_{2-x}SiO_4$:Eu wherein $0 \leq x \leq 2$, the spectra (indicated by solid line a' in the figure) of the magnesium chloride-containing phospholuminescent composition lower in photoluminescence intensity in the near ultraviolet region (e.g. at a wavelength of 360 nm) and the photoluminescence intensity in the blue region (e.g. at a wavelength of 440 nm) is remarkably improved.

This tendency likely appears when using other types of magnesium-based additives (including magnesium carbonate, magnesium sulfate and magnesium fluoride).

Figure 4:
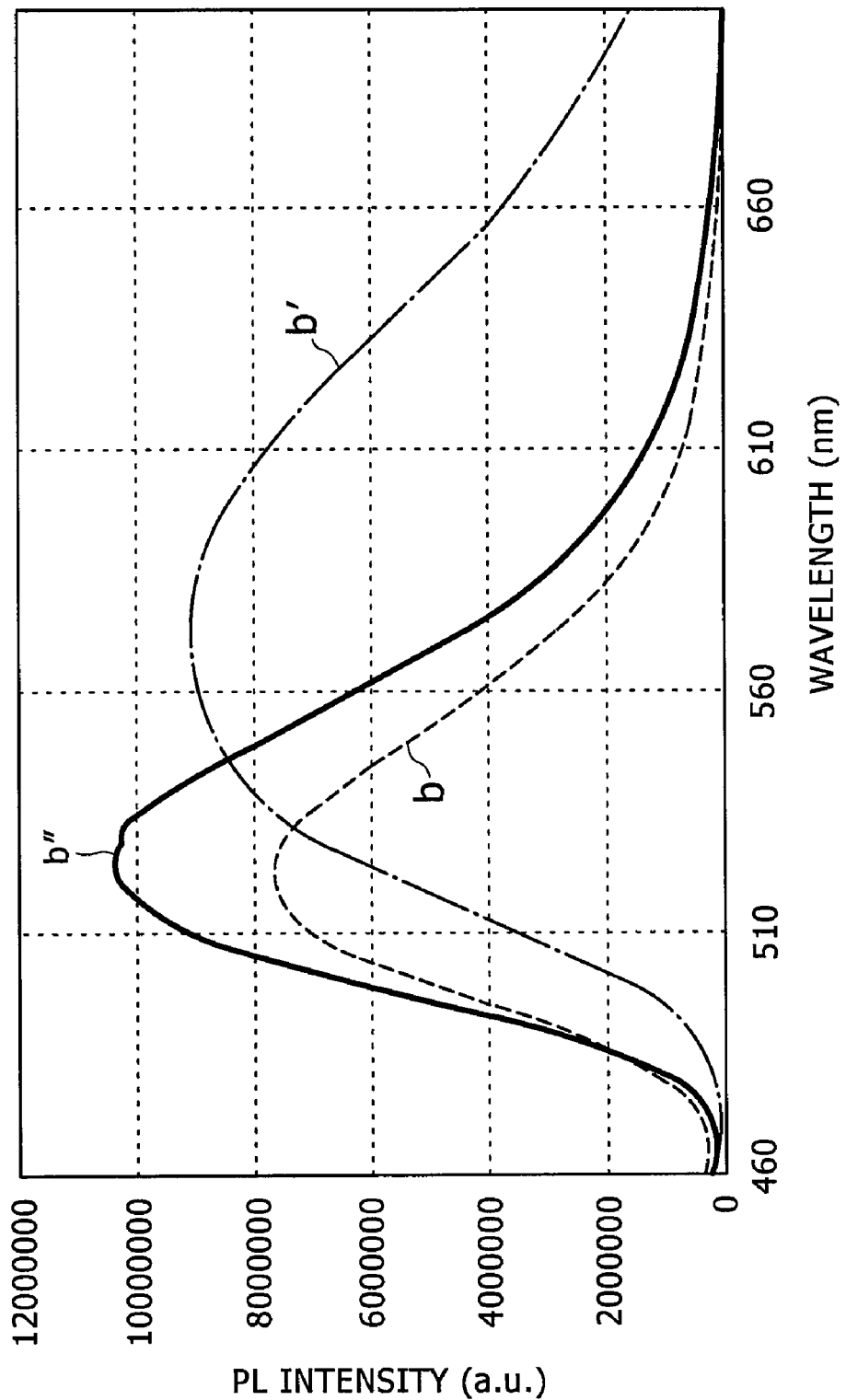
FIG. 4 is a photoluminescence spectrum chart for illustrating an example of a phospholuminescent composition of an embodiment.

Emission spectra of a phospholuminescent composition including a phosphor having a composition of $Sr_xBa_{2-x}SiO_4$:Eu wherein $0 \leq x \leq 2$ and a magnesium salt (in an amount of 30 mols) are shown in FIG. 4 In fact, the measurement of the spectra was carried out for three types of compositions of the above formula wherein x=0, 1 and 2, and because a similar tendency was shown, the results of the case where x=0.5 are shown in FIG. 4 as an instance.

The emission spectra (broken line b in the figure) of the phosphor alone having such a composition as indicated above was found to be lower in phospholuminescent intensity than those emission spectra (indicated by dot-dash line b') of the PTA:Ce phosphor ordinarily used as a light source device capable of emitting white light. The emission spectra (indicated by solid line b" in the figure) of the phospholuminescent composition including the phosphor having such a composition as indicated above and a magnesium salt (in an amount of 30 mols) according to the embodiment were confirmed as being higher in the phospholuminescent intensity.

This tendency is true of other types of magnesium-based additives (such as magnesium carbonate, magnesium sulfate and magnesium fluoride).

Second Example

In this example, characteristics of phospholuminescent compositions were checked using an light source device closer in arrangement to such a light source device as set out hereinbefore.

A phospholuminescent composition including a phosphor having a composition represented by $Sr_xBa_{2-x}SiO_4$:Eu wherein $0 \leq x \leq 2$, and a magnesium salt (amount: 30 mols) was mixed with a resin and the resulting mixture was potted on a blue LED to evaluate an emission characteristic. In this example, a phosphor of the above formula where x=2 was prepared and a difference in luminosity depending on the presence or absence of magnesium chloride to be added was checked.

Here, the luminosity means beam of light emitted from a point of light source per unit solid angle.

The results of the check reveal that the luminosity of the case where magnesium chloride was added is improved by 32% over the case of no addition.

For a second phosphor whose emission center wavelength exists at a side longer than that of the phosphor represented by the above formula, a red phosphor (with a peak wavelength of 658 nm) having a composition of CaS:Eu and capable of excitation with light in a blue region was provided and these two phosphors were blended, to which a magnesium-based additive was added so as to check an emission characteristic, revealing that a color temperature of 3,000 K was obtained.

When a blending ratio of the red phosphor is increased, a light source device wherein a color temperature of 3,000 K or below is obtained can be constituted.

The embodiments of the phospholuminescent composition and light source device have been illustrated hereinabove the materials and amounts thereof, and numerical values such as a treating time and a weight indicated in these embodiment are described by way of preferred example, and the dimensional shape and positional arrangement are, respectively, shown only schematically. That is, the embodiments should not be construed as limiting to these examples.

For instance, in the light source device according to an embodiment a phosphor coating may be made up of a mixture of two or more phosphors of the formula $Sr_xBa_{2-x}SiO_4$:Eu with different values of x in order to improve color rendering properties.

In the above embodiments, although the instance where LED is used as a blue light source in the light source device has been illustrated, other types of phosphors may be used as a blue light source.

Furthermore, in the foregoing embodiments, although the instance where a light source device using a blue light source alone as a preferred device so as to suppress degradation of the resin of the optical transmission portion has been described as a light source device, the light source device is not limited thereto. For instance, the device may have both a ultraviolet light source and a blue light source and takes such an arrangement that a phosphor is excited by means of both light sources. In this way, many variations and modifications are possible.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A phospholuminescent composition comprising:
   a phosphor having a composition represented by $Sr_xBa_{2-x}SiO_4$:Eu, wherein $0 \leq x \leq 2$; and
   a magnesium salt added to said phosphor,
   wherein said composition has an excitation spectra such that an intensity at a wavelength of 440 nm ranges from 1.2 to 1.3 times an intensity of said phosphor alone at a wavelength of 440 nm,
   wherein an amount of said magnesium salt is between 30 mols and 40 mols per 100 mols of said phosphor.

2. The phospholuminescent composition according to claim 1, wherein a concentration of Eu in the compositional formula ranges from 1 mol % to 9 mol %.

3. The phospholuminescent composition according to claim 1, wherein said magnesium salt is a member selected from the group consisting of magnesium carbonate, magnesium sulfate and a mixture thereof.

4. A light source device comprising:
   a blue light source; and
   a phospholuminescent composition including a phosphor having a composition represented by $Sr_xBa_{2-x}SiO_4$:Eu wherein $0 \leq x \leq 2$, and a magnesium salt added to said phosphor,
   wherein said composition has an excitation spectra such that the ratio of the intensity at a wavelength of 440 nm to the intensity at a wavelength of 360 nm is in the range of 0.82 to 0.85, and
   wherein an amount of said magnesium salt is between 30 mols and 40 mols per 100 mols of said phosphor.

5. The light source device according to claim 4, further comprising a second phosphor which is excited with light from said blue light source and whose emission center wavelength is longer than that of said phosphor.

6. A light source device comprising:
   a blue light source; and
   a phospholuminescent composition, including a phosphor having a composition represented by $Sr_xBa_{2-x}SiO_4$:Eu wherein $0 \leq x \leq 2$, and a magnesium salt added to said phosphor,
   wherein said composition has such excitation spectra that an intensity at a wavelength of 440 nm ranges from 1.2 to 1.3 times an intensity of said phosphor alone at a wavelength of 440 nm, and
   wherein an amount of said magnesium salt is between 30 mols and 40 mols per 100 mols of said phosphor.

7. The light source device according to claim 6, further comprising a second phosphor which is excited with light from said blue light source and whose emission center wavelength is longer than that of said phosphor.

* * * * *